United States Patent
Yamagata

(10) Patent No.: US 11,454,754 B2
(45) Date of Patent: Sep. 27, 2022

(54) SWITCH DEVICE AND OPERATION DEVICE

(71) Applicant: ALPS ALPINE CO., LTD., Tokyo (JP)

(72) Inventor: Kazuyoshi Yamagata, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/245,248

(22) Filed: Apr. 30, 2021

(65) Prior Publication Data

US 2021/0247558 A1    Aug. 12, 2021

Related U.S. Application Data

(63) Continuation of application No. PCT/JP2019/043403, filed on Nov. 6, 2019.

(30) Foreign Application Priority Data

Dec. 13, 2018  (JP) .............................. JP2018-233636

(51) Int. Cl.
*H01H 13/14*  (2006.01)
*F21V 8/00*   (2006.01)
*B60R 16/02*  (2006.01)

(52) U.S. Cl.
CPC .............. *G02B 6/001* (2013.01); *B60R 16/02* (2013.01); *H01H 13/14* (2013.01)

(58) Field of Classification Search
CPC ......... G02B 6/001; B60R 16/02; H01H 13/14
See application file for complete search history.

(56) References Cited

U.S. PATENT DOCUMENTS

| 4,343,975 A | * | 8/1982 | Sado ...................... H01H 13/83 |
| | | | 362/602 |
| 2010/0314229 A1 | * | 12/2010 | Ominato .............. H01H 13/023 |
| | | | 200/314 |
| 2014/0166458 A1 | | 6/2014 | Chen |
| 2014/0369020 A1 | * | 12/2014 | Chen .................... H01H 13/702 |
| | | | 362/23.03 |

FOREIGN PATENT DOCUMENTS

| CN | 201022058 | | 2/2008 |
| JP | H01-154414 | | 6/1989 |
| JP | 2001-155576 | | 6/2001 |
| JP | 2001155576 A | * 6/2001 | ........... H01H 13/023 |
| JP | 2002-352656 | | 12/2002 |
| JP | 2007-080763 | | 3/2007 |
| JP | 2012-114031 | | 6/2012 |

OTHER PUBLICATIONS

International Search Report for PCT/JP2019/043403 dated Jan. 7, 2020.

* cited by examiner

*Primary Examiner* — Fatima N Farokhrooz
(74) *Attorney, Agent, or Firm* — IPUSA, PLLC

(57) ABSTRACT

A device includes a housing; a substrate provided inside the housing; a light emitting object mounted on one side of the substrate; and an elastic sheet covering the one side of the substrate and the light emitting object, to guide light from the light emitting object. A through hole is formed in the housing corresponding to the one side of the substrate. The elastic sheet has a mirror part at a portion on the surface corresponding to the through hole, for totally reflecting light transmitting through an inside of the elastic sheet.

10 Claims, 7 Drawing Sheets

US 11,454,754 B2

SWITCH DEVICE AND OPERATION DEVICE

CROSS-REFERENCE TO RELATED APPLICATION

The present U.S. non-provisional application is a continuation application of and claims the benefit of priority under 35 U.S.C. § 365(c) from PCT International Application PCT/JP2019/043403 filed on Nov. 6, 2019, which is designated the U.S., and is based upon and claims the benefit of priority of Japanese Patent Application No. 2018-233636 filed on Dec. 13, 2018, the entire contents of which are incorporated herein by reference.

BACKGROUND OF THE INVENTION

1. Field of the Invention

The present disclosure relates to a device and an operation device.

2. Description of the Related Art

Conventionally, a technique has been devised in which a surface of a substrate provided inside a housing is covered with a cover made of a material having optical transparency, so as to protect the surface of the substrate, and to cause light emitted from a light emitting object mounted on the substrate to transmit through the cover, to be guided to a predetermined light emitting part exposed from the surface of the housing.

For example, in Japanese Laid-Open Patent Application No. 2007-80763, a technique is disclosed in which a cover member for a switch is integrally formed with a push button having optical transparency so that light emitted from a light source provided on the lower side of the push button can be guided to the ceiling portion of the push button, and a light shielding layer is provided on the inner wall surface of a space formed on the lower side of the push button, so as to prevent light emitted from the light source from leaking in the side surface directions of the push button.

The inventors of the present disclosure have found that light emitted from the light emitting object mounted on the substrate may not completely transmit through the cover, and may be guided through the inside of the cover to leak out of a through hole formed in the housing, and thus, the conventional technique cannot suppress such leak of light; therefore, there is a need for techniques for suppressing leak of light out of a through hole, including the leak of light as mentioned above.

SUMMARY OF THE INVENTION

A device of an embodiment includes a housing; a substrate provided inside the housing; a light emitting object mounted on one side of the substrate; and an elastic sheet covering the one side of the substrate and the light emitting object, to guide light from the light emitting object, wherein a through hole is formed in the housing corresponding to the one side of the substrate, and wherein the elastic sheet has a mirror part at a portion on the surface corresponding to the through hole, for totally reflecting light transmitting through an inside of the elastic sheet.

DESCRIPTION OF THE PREFERRED EMBODIMENTS

Figure 1:
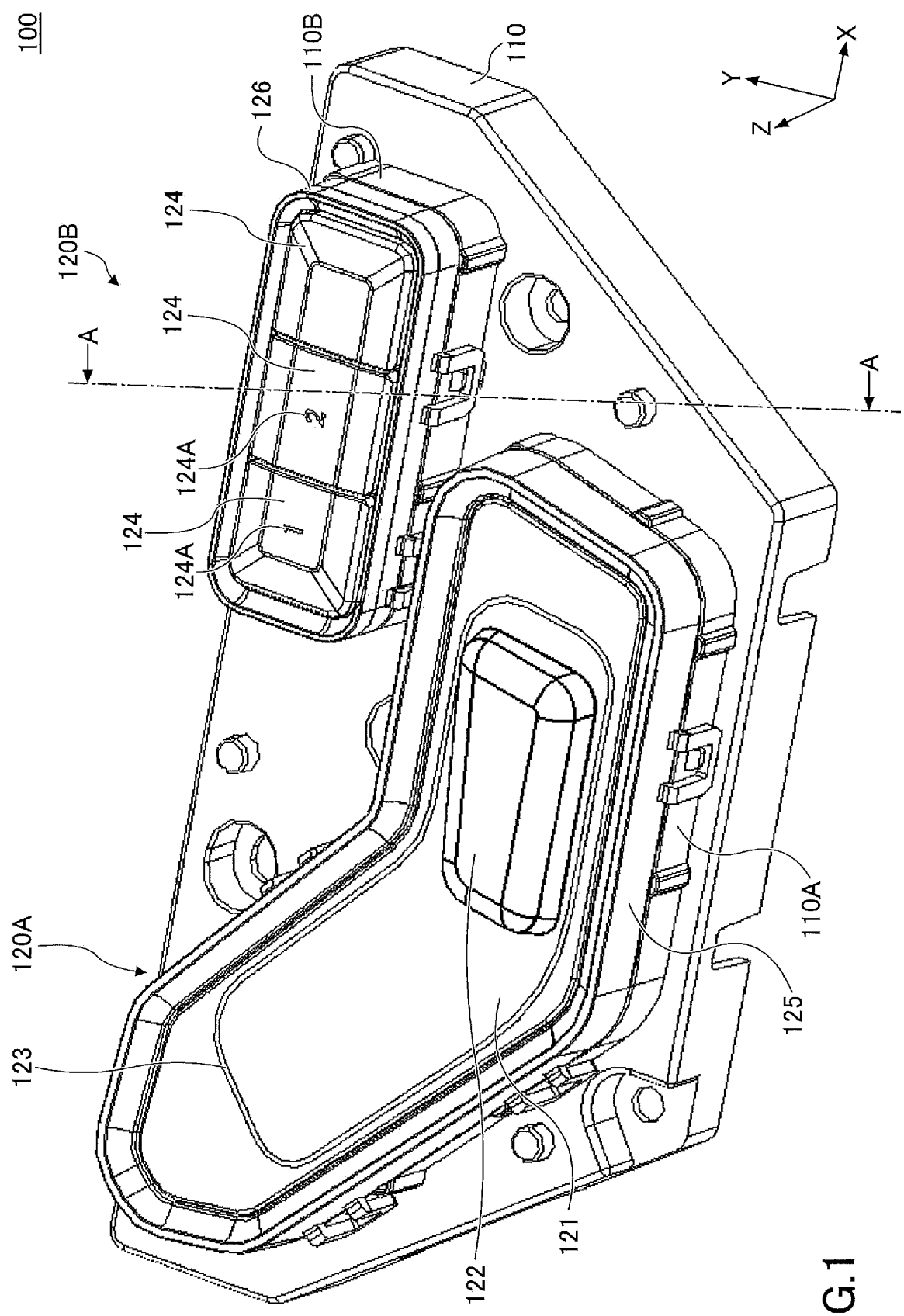
FIG. 1 is an external perspective view of a power seat switch according to an embodiment.

In the following, embodiments will be described with reference to the drawings. Note that in the following description, for the sake of convenience, the Z-axis positive direction in the drawings is defined as the upside (an example of "one side" described in the claims), and the Z-axis negative direction in the drawings is defined as the downside (an example of "another side" described in the claims).

According to an embodiment, leak of light from a through hole formed in a housing can be suppressed.

(Summary of Power Seat Switch 100)

FIG. 1 is an external perspective view of a power seat switch 100 according to an embodiment. The power seat switch 100 illustrated in FIG. 1 is an example of a "device" and an "operation device" described in the claims, and is a device for operating a power seat of a vehicle. For example, the power seat switch 100 is arranged at a predetermined position in a vehicle (e.g., on the vehicle interior side of a door on the driver's seat side).

As illustrated in FIG. 1, the power seat switch 100 is provided with a housing 110 (an example of a "housing" described in the claims). A pedestal 110A and a pedestal 110B are formed on the top surface of the housing 110, to be partially raised. The pedestal 110A is provided with an operation panel unit 120A. The pedestal 110B is provided with an operation panel unit 120B.

The operation panel unit 120A includes an operation panel 121, an operation knob 122, a light emitting part 123, and a bezel 125 (an example of an "attachment member" described in the claims). The operation panel 121 is a member having a horizontal planar shape. The operation knob 122 is provided on the surface of the operation panel 121. The operation knob 122 is an operation member through which switching operations (e.g., press operation, slide operation, tilt operation) are performed on switches 136 (see FIG. 3), to make various adjustments of the power seat (e.g., reclining adjustment, height adjustment, tilt adjustment, back-and-forth position adjustment).

The light emitting part 123 is a belt-shaped member surrounding the operation knob 122. The light emitting part 123 has optical transparency, transmits light emitted from LEDs 134 (see FIG. 3) provided inside the housing 110, and emits the light; this makes it possible to improve discernibility of the position of the operation knob 122.

The bezel 125 is a member that surrounds the operation panel unit 120A along the outer periphery of the operation panel unit 120A. The bezel 125 has a three-dimensional shape or a decorative function when applied with surface finishing by chromium plating or the like, and has a snap-fit structure to be detachably attached to the pedestal 110A.

The operation panel unit 120B has multiple operation objects 124 and a bezel 126 (an example of an "attachment member" described in the claims). The multiple operation objects 124 are operation members through which switching operations (e.g., a press operation) are performed on switches 135 (see FIG. 3) for storing and calling adjustment values of the power seat for each user.

On the surface of each of the operation objects 124, a light emitting part 124A having a character or figure shape is provided. The light emitting part 124A has optical transparency, transmits light emitted from an LED 133 provided inside the housing 110, and emits the light; this makes it possible to improve discernibility of the position and function of each operation object 124.

The bezel 126 is a member that surrounds the operation panel unit 120B along the outer periphery of the operation panel unit 120B. The bezel 126 has a three-dimensional shape or a decorative function when applied with surface finishing by chromium plating or the like, and has a snap-fit structure to be detachably attached to the pedestal 110B.

The power seat switch 100 has an outlet (not illustrated) provided on a side surface of the housing 110, and by having the outlet connected a connector (not illustrated), becomes electrically connected to a control unit installed in the vehicle via the connector and a cable. By this connection, the power seat switch 100 can output an electrical signal in response to a switching operation performed on the operation knob 122 or the operation object 124 to the control unit, and cause the control unit to control the power seat.

(Configuration of Power Seat Switch 100)

Figure 2:
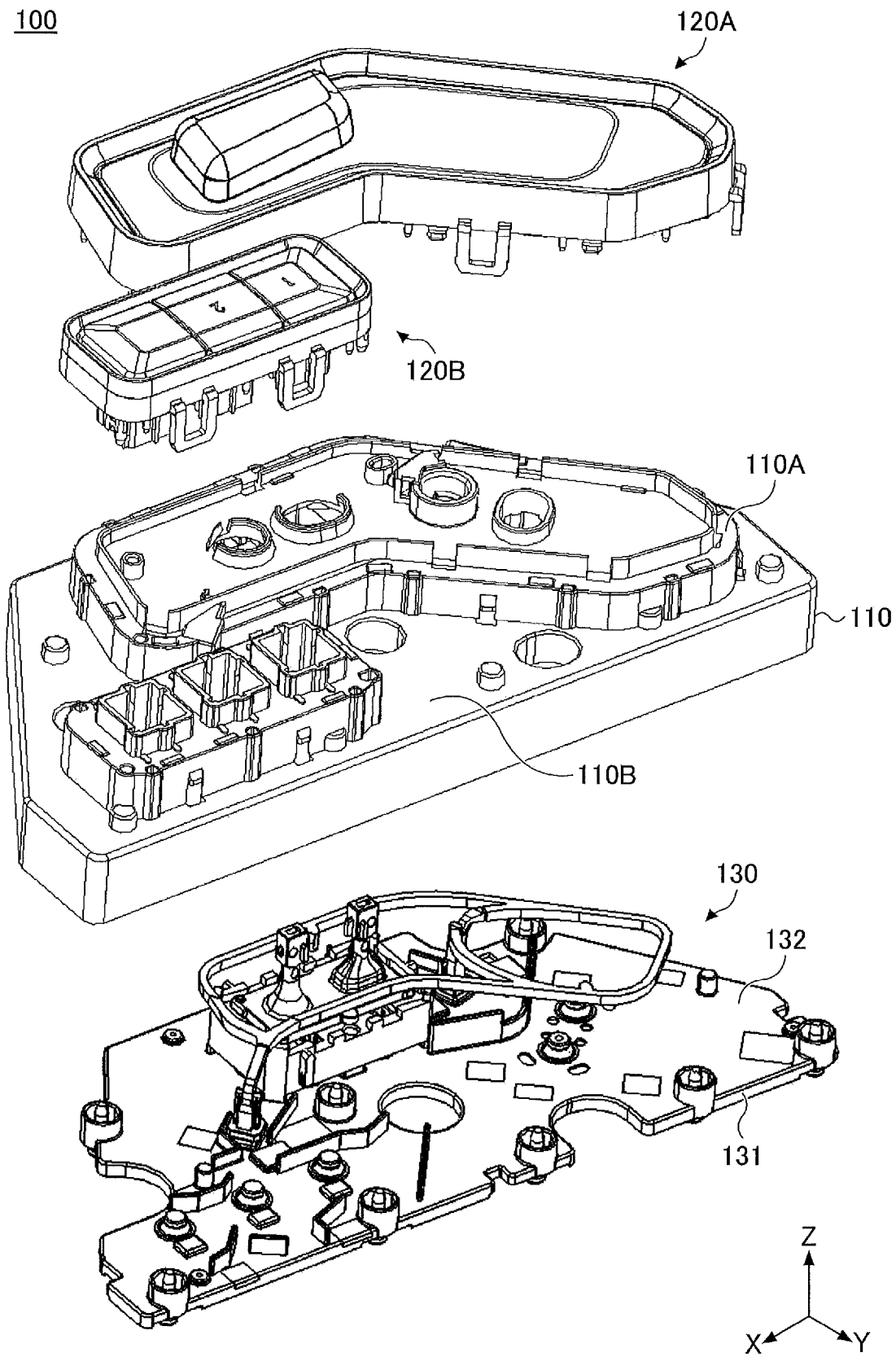
FIG. 2 is an exploded perspective view of a power seat switch according to an embodiment.

FIG. 2 is an exploded perspective view of the power seat switch 100 according to an embodiment. As illustrated in FIG. 2, the power seat switch 100 is configured to include the operation panel unit 120A, the operation panel unit 120B, the housing 110, and a substrate unit 130, in this order from the upside.

The housing 110 is a container-like member having an internal space 110C and a downward opening on the downside. For example, the housing 110 is formed by injection molding with a resin material. As described with FIG. 1, the pedestals 110A and 110B that are formed on the top surface of the housing 110 are provided with the operation panel units 120A and 120B.

The internal space 110C contains the substrate unit 130. The substrate unit 130 is configured to have a flat-shaped substrate 131 (an example of a "substrate" described in the claims) on which multiple electronic components (e.g., the switches 135 and 136, the LEDs 133 and 134, and the like) are mounted. The switches 135 and 136 mounted on the substrate 131 are connected to the corresponding operation knob 122 and operation objects 124 through openings formed on upper portions of the pedestals 110A and 110B of the housing 110, and thereby, switching operations can be performed through the operation knob 122 and the operation objects 124.

The surface of the substrate 131 is entirely covered by a rubber sheet 132 to improve the waterproofness. Note that the downward opening of the housing 110 is closed when an under panel (not illustrated) is attached.

(Configuration of Substrate 131)

Figure 3:
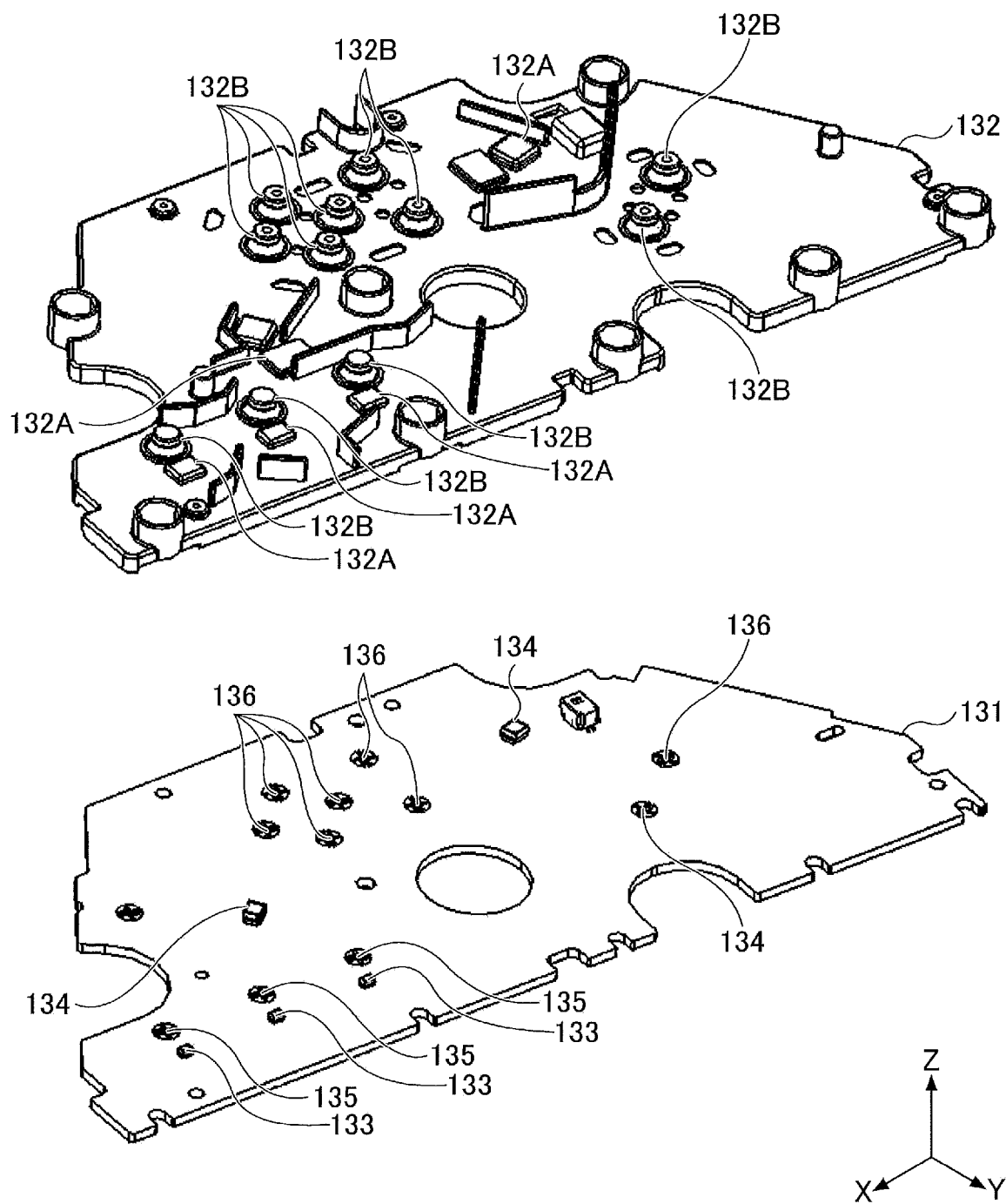
FIG. 3 is a diagram illustrating a configuration of a substrate provided in a power seat switch according to an embodiment.

FIG. 3 is a diagram illustrating a configuration of a substrate 131 provided in the power seat switch 100 according to an embodiment. As illustrated in FIG. 3, the substrate 131 is a flat-shaped member on which multiple electronic components are mounted. For example, a PWB (Printed Wiring Board) made of an insulating material such as glass epoxy is used for the substrate 131. On the surface of the substrate 131, the multiple LEDs 133, the multiple LEDs 134, the multiple switches 135, and the multiple switches 136 are mounted. Note that in FIG. 3, in order to make it easier to understand the arrangement of the LEDs 133 and 134 and the switches 135 and 136 on the surface of the substrate 131, some parts mounted on the surface of the substrate 131 are not illustrated.

The multiple LEDs 133 are arranged on the lower side of the operation objects 124. Each of the LEDs 133 is an example of an "light emitting object" that emits light from the lower side toward the light emitting part 124A provided on the operation object 124, and thereby, causes the light emitting part 124A to emit light. The multiple LEDs 134 are arranged on the lower side of the operation panel 121. Each of the LEDs 134 emits light to the light emitting part 123 provided on the operation panel 121, and thereby, causes the light emitting part 123 to emit light.

The multiple switches 135 are arranged on the lower side of the operation objects 124. Each of the switches 135 executes a switching operation in conjunction with a switching operation performed on each operation object 124, to store and call adjustment values of the power seat for each user. The multiple switches 136 are arranged on the lower side of the operation panel 121. Each of the switches 136 executes a switching operation in conjunction with a switching operation performed on the operation knob 122, to make various adjustments of the power seat.

The surface of the substrate 131 is entirely covered by the rubber sheet 132 in a state where the electronic components are mounted. The rubber sheet 132 is an example of an "elastic sheet" described in the claims, and is a sheet-shaped member having flexibility. For example, the rubber sheet 132 is formed by press molding an elastic material such as rubber, silicone, or the like. The rubber sheet 132 has a shape substantially the same as the substrate 131 in plan view from the above. Therefore, the rubber sheet 132 can cover the surface of the substrate 131 entirely. The substrate 131 is covered by the rubber sheet 132, and thereby, the waterproofness is improved. Note that the rubber sheet 132 is formed of an elastic material having optical transparency. Therefore, the rubber sheet 132 can transmit light emitted from the LEDs 133 and 134 upward in a state where the LEDs 133 and 134 are covered.

The rubber sheet 132 is integrally formed with protruding parts 132A projecting upward at positions overlapping with the LEDs 133 and 134, and in a state where the LEDs 133 and 134 are contained in a space in which the lower sides of the protruding parts 132A are open, light of the LEDs 133 and 134 can be emitted upward from the surface of the protruding parts 132A. Also, the rubber sheet 132 has protruding parts 132B projecting upward at positions overlapping with the switches 135 and 136, and the switches 135 and 136 are contained in a space in which the lower sides of the protruding parts 132B are open. Each of the switches 135 and 136 causes the corresponding protruding part 132B to elastically deform in response to an operation performed on the operation knob 122 or the operation object 124, and thereby, an operation can be performed.

(Light Leakage Suppressing Structure of Power Seat Switch 100)

Figure 4:
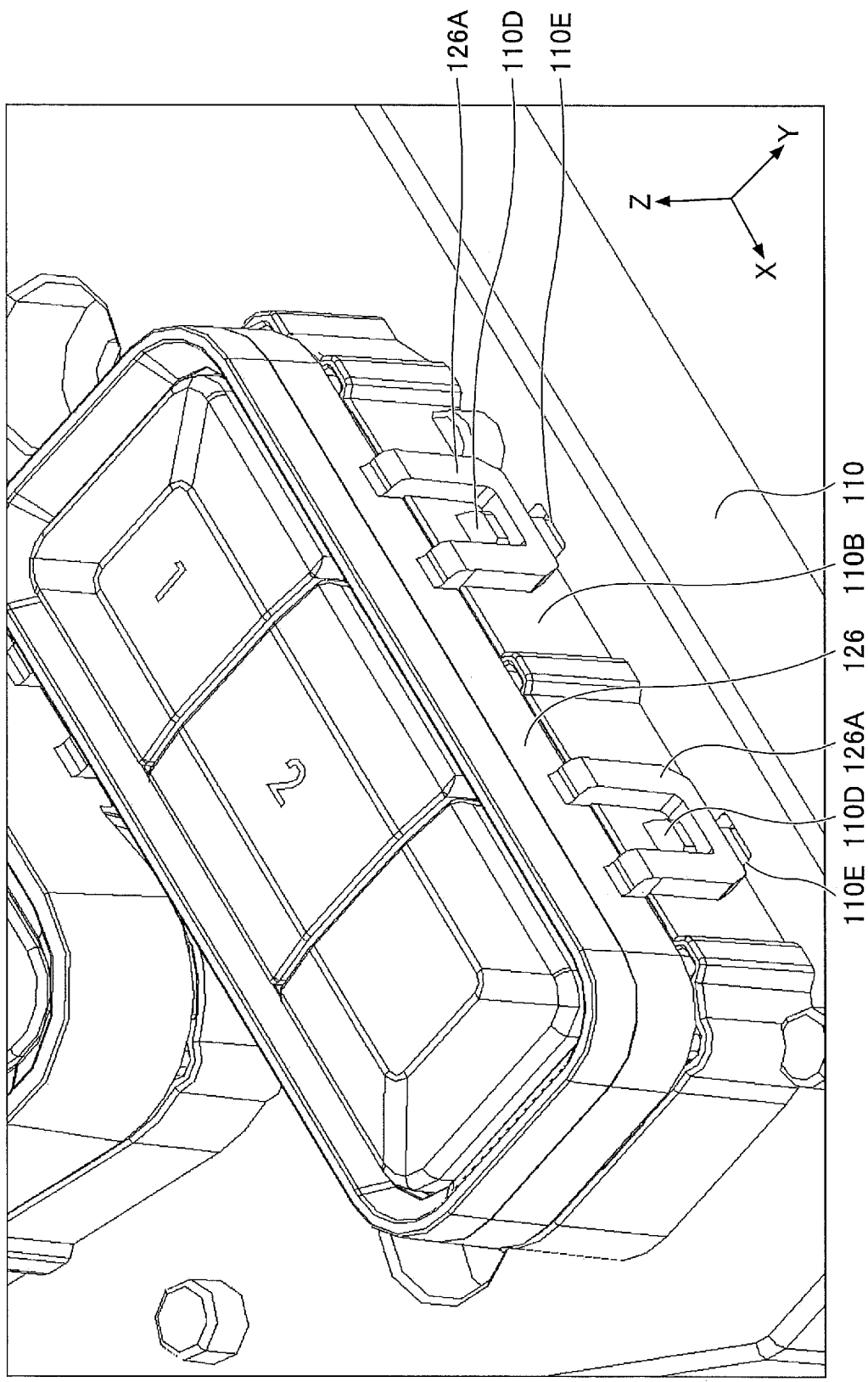
FIG. 4 is a partially enlarged view illustrating an attachment structure of a panel in a power seat switch according to an embodiment.

In the following, a light leakage suppressing structure of the power seat switch 100 will be described. FIG. 4 is a partially enlarged view illustrating an attachment structure of the bezel 126 in the power seat switch 100 according to an embodiment.

The bezel 126 is attached to the pedestal 110B by using a what-is-called snap-fit structure. Specifically, as illustrated in FIG. 4, the side surfaces of the bezel 126 are provided with hooks 126A that hang downward. On the other hand, on the side surfaces of the pedestal 110B, engagement claws 110D are provided. Each of the hooks 126A is fitted with the corresponding engagement claw 110D in a state of being expanded in a direction corresponding to the shape of the engagement claw 110D, to be engaged with the engagement claw 110D. In this way, the bezel 126 is fixedly and detachably attached to the pedestal 110B provided on the upper side of the housing 110. Note that the bezel 125 is attached to the pedestal 110A by using a similar snap-fit structure.

As illustrated in FIG. 4, on the surface of the housing 110, at a position directly beneath each of the engagement claws 110D, a through hole 110E (an example of the "through hole" described in the claims) is formed. In other words, the engagement claw 110D is provided above the through hole 110E, corresponding to the through hole 110E. The through holes 110E penetrate through the upper part of the housing 110 in the vertical direction, to communicate with the internal space 110C. The through holes 110E are formed for extracting a mold for forming the engagement claws 110D when forming the engagement claws 110D. The through holes 110E might cause light emitted from the LEDs 133 and 134 to leak to the outside. Thereupon, the power seat switch 100 of the present embodiment has a light leakage suppressing structure so as to prevent occurrence of leak of light out of the through holes 110E.

Note that the bezels 125 and 126 are fixed to the pedestals 110A and 110B, respectively, by the snap-fit structure at multiple locations along the outer peripheries. In other words, the multiple through holes 110E are formed on the upper part of the housing 110 along the outer peripheries of the pedestals 110A and 110B. Therefore, the power seat switch 100 of the present embodiment has a light leakage suppressing structure so as to prevent occurrence of leak of light, for each of the multiple through holes 110E.

Figure 5:
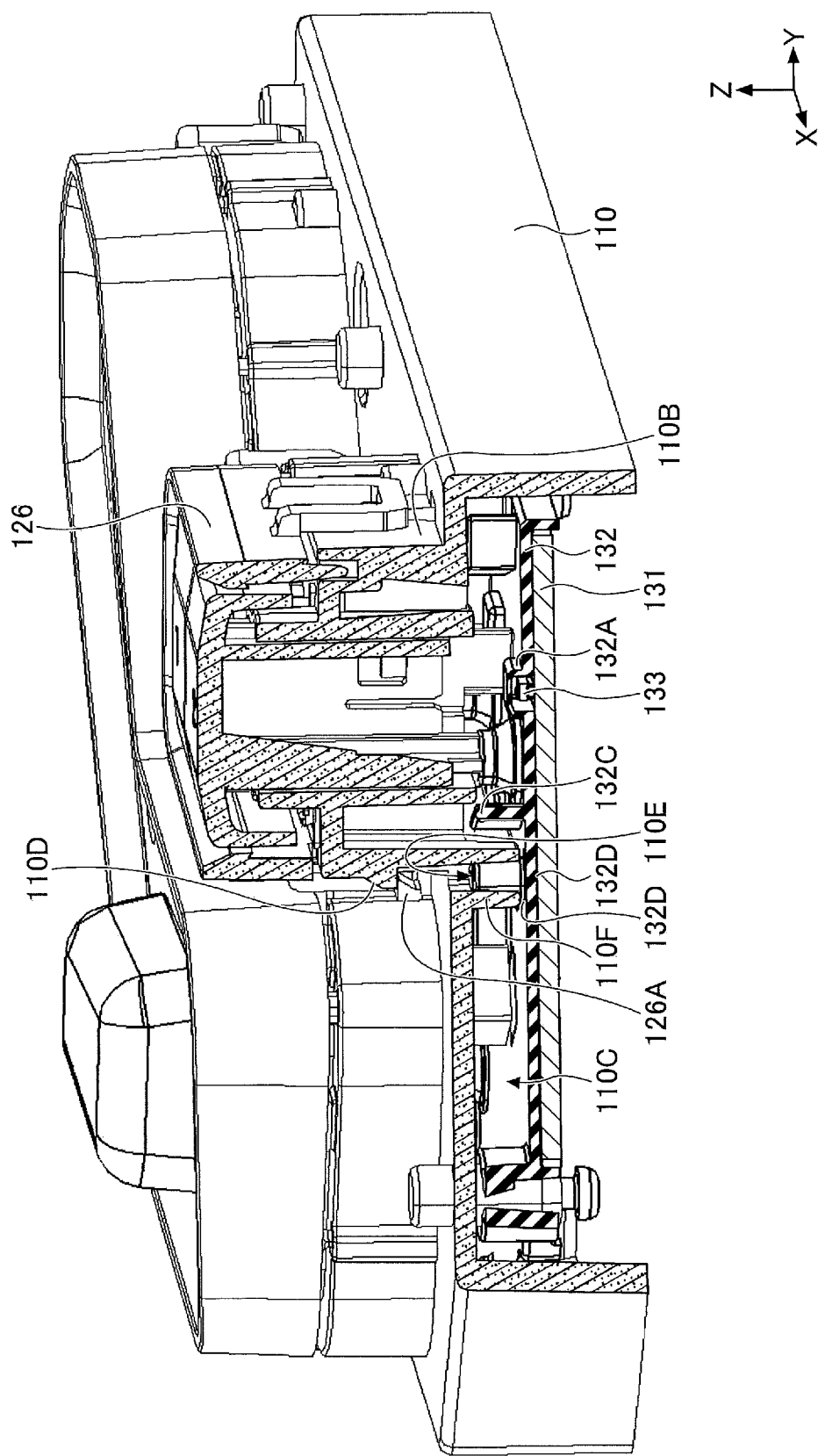
FIG. 5 is a cross sectional view of the power seat switch illustrated in FIG. 1 along a line A-A.
Figure 6:
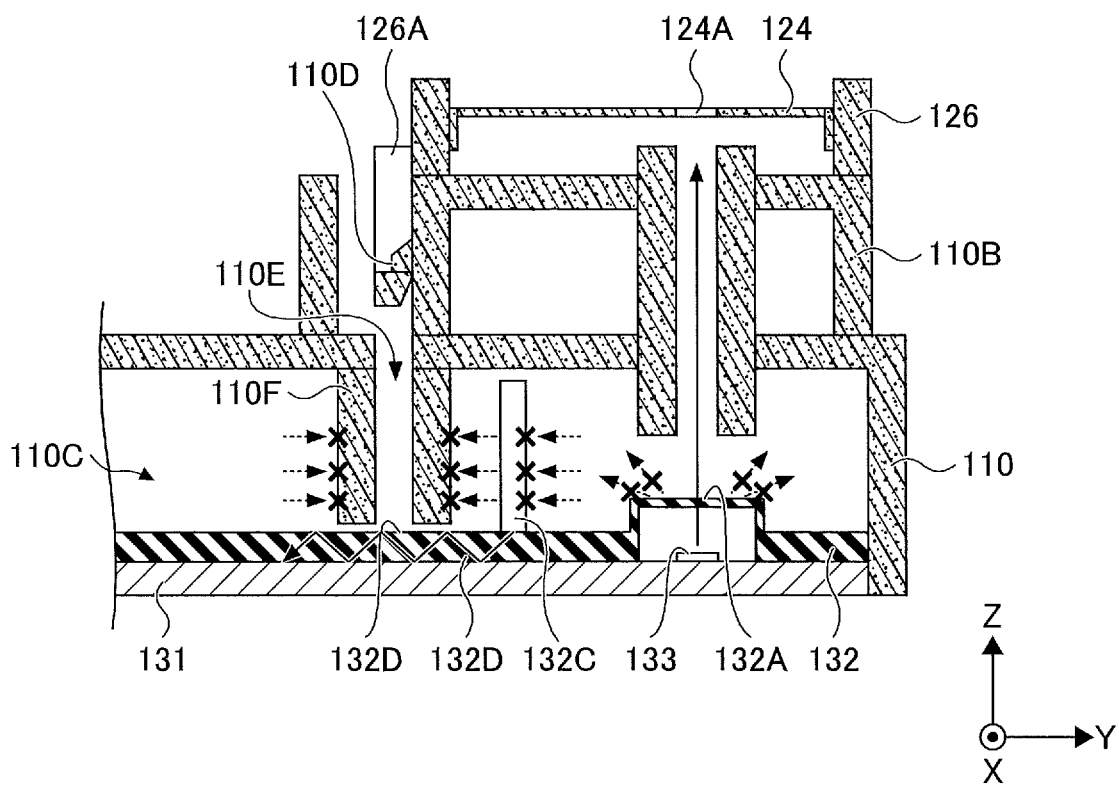
FIG. 6 is a schematic diagram illustrating a light leakage suppressing structure of the power seat switch illustrated in FIG. 5.

FIG. 5 is a cross sectional view illustrating the power seat switch 100 illustrated in FIG. 1 along a line A-A, and is a diagram for illustrating a light leakage suppressing structure of the power seat switch 100. FIG. 6 is a schematic diagram illustrating the light leakage suppressing structure of the power seat switch 100 illustrated in FIG. 5.

As illustrated in FIGS. 5 and 6, on the internal space 110C side of the upper wall part of the housing 110, a cylinder-shaped cylinder part 110F surrounding the through hole 110E is provided at the position where the through hole 110E is formed, and extends downward. Configured in this way, the power seat switch 100 of the present embodiment can shield light guided through the inside of the internal space 110C, so as to prevent the light from entering the through hole 110E by the cylinder part 110F. Therefore, the power seat switch 100 of the present embodiment can suppress leak of light out of the through holes 110E.

Note that although the lower edge of the cylinder part 110F is located close to the surface of the rubber sheet 132 in the power seat switch 100 of the present embodiment, the lower edge of the cylinder part 110F is configured not to contact the surface of the rubber sheet 132 in consideration of dimensional errors. However, the configuration is not limited as such, and the lower edge of the cylinder part 110F may be configured to contact the surface of the rubber sheet 132. This configuration can further suppress entry of light through the inside of the internal space 110C into the through hole 110E.

Also, as illustrated in FIGS. 5 and 6, a wall part 132C that stands vertically is provided between the through hole 110E and the protruding part 132A on the surface of the rubber sheet 132. Configured in this way, the power seat switch 100 of the present embodiment can shield light emitted from the LEDs 133 and 134 and guided through the inside of the internal space 110C toward the through hole 110E, by the wall part 132C, so as to prevent the light from entering the vicinity of the through hole 110E. Therefore, the power seat switch 100 of the present embodiment can suppress leak of light out of the through holes 110E.

Note that in the power seat switch 100 of the present embodiment, although the upper end of the wall part 132C is located close to the upper wall part of the housing 110, the upper end of the wall part 132C is configured not to contact the upper wall part of the housing 110 in consideration of dimensional errors. However, the configuration is not limited as such, and the upper end of the wall part 132C may be configured to contact the wall part of the housing 110. This configuration can further suppress entry of light through the inside of the internal space 110C into the vicinity of the through hole 110E.

Also, as illustrated in FIGS. 5 and 6, at a portion of the rubber sheet 132 corresponding to the through hole 110E, a mirror part 132D (examples of a "mirror part" described in the claims) are provided. In particular, at the portions of the rubber sheet 132 corresponding to the through holes 110E, the mirror parts 132D are provided on the top surface (a surface on the through hole 110E side) and on the bottom surface (a surface on the substrate 131 side) of the rubber sheet 132.

The mirror parts 132D provided on the top surface of the rubber sheet 132 can totally reflect light emitted from the LEDs 133 and 134 and guided through the inside of the rubber sheet 132; and thereby, at the position where the mirror part 132D is formed, the power seat switch 100 of the present embodiment can suppress emission of the light out of the top surface of the rubber sheet 132, due to refraction of light guided through the inside of the rubber sheet 132 at the top surface of the rubber sheet 132.

The mirror parts 132D provided on the bottom surface of the rubber sheet 132 can totally reflect light emitted from the LEDs 133 and 134 and guided through the inside of the rubber sheet 132; and thereby, at the position where the mirror part 132D is formed, the power seat switch 100 of the present embodiment can suppress emission of the light out of the top surface of the rubber sheet 132, due to scattering of light guided through the inside of the rubber sheet 132 at the bottom surface of the rubber sheet 132.

It is favorable to provide the mirror part 132D at a position overlapping the through hole 110E, at least in plan view from the above; and it is also favorable that the mirror part 132D has a shape and a size to cover the entirety of the through hole 110E.

Note that on the surfaces of the rubber sheet 132, surface texturing (an example of a "textured portion" described in the claims) is applied to planar portions (including a portion between the mirror parts 132D and the protruding parts 132A) other than the mirror parts 132D. For example, the mirror parts 132D can be formed with a mold for press molding of the rubber sheet 132 in which unevenness for the surface texturing is not formed partially. Although the mirror parts 132D have a lower release performance of the mold compared with the portions to which the surface texturing is applied, the power seat switch 100 of the present embodiment is configured to have the mirror parts 132D partially provided on the surface of the rubber sheet 132; therefore, the configuration has a higher release performance of the mold, compared to a configuration in which mirroring is applied to the entire surface of the rubber sheet 132.

Also, in the power seat switch 100 of the present embodiment, mirroring is also applied to the surfaces of the protruding parts 132A of the rubber sheet 132; and thereby, the power seat switch 100 of the present embodiment can cause light emitted from each of the LEDs 133 and 134 to be emitted upward from the protruding part 132A, and efficiently guide the light to a part to be irradiated (the light emitting part 123 or 124A), without scattering the light on the surface of the protruding part 132A. As a result, the amount of light directed to the through hole 110E from the protruding part 132A can be suppressed, and thereby, can suppress leak of light out of the through hole 110E. Note that the surface of the protruding part 132A of the rubber sheet 132 is formed to be a very thin film, and thereby, the upward light transmittance is further improved.

Note that each of the components (the cylinder parts 110F, the wall parts 132C, the mirror parts 132D, and the protruding parts 132A) of the light leakage suppressing structure described above is integrally formed with the rubber sheet 132 or the housing 110, and additional work is not required for attachment to the rubber sheet 132 or the housing 110; and thereby, the power seat switch 100 of the present embodiment has improved assembly easiness.

(Surface Configuration of Rubber Sheet 132)

Figure 7:
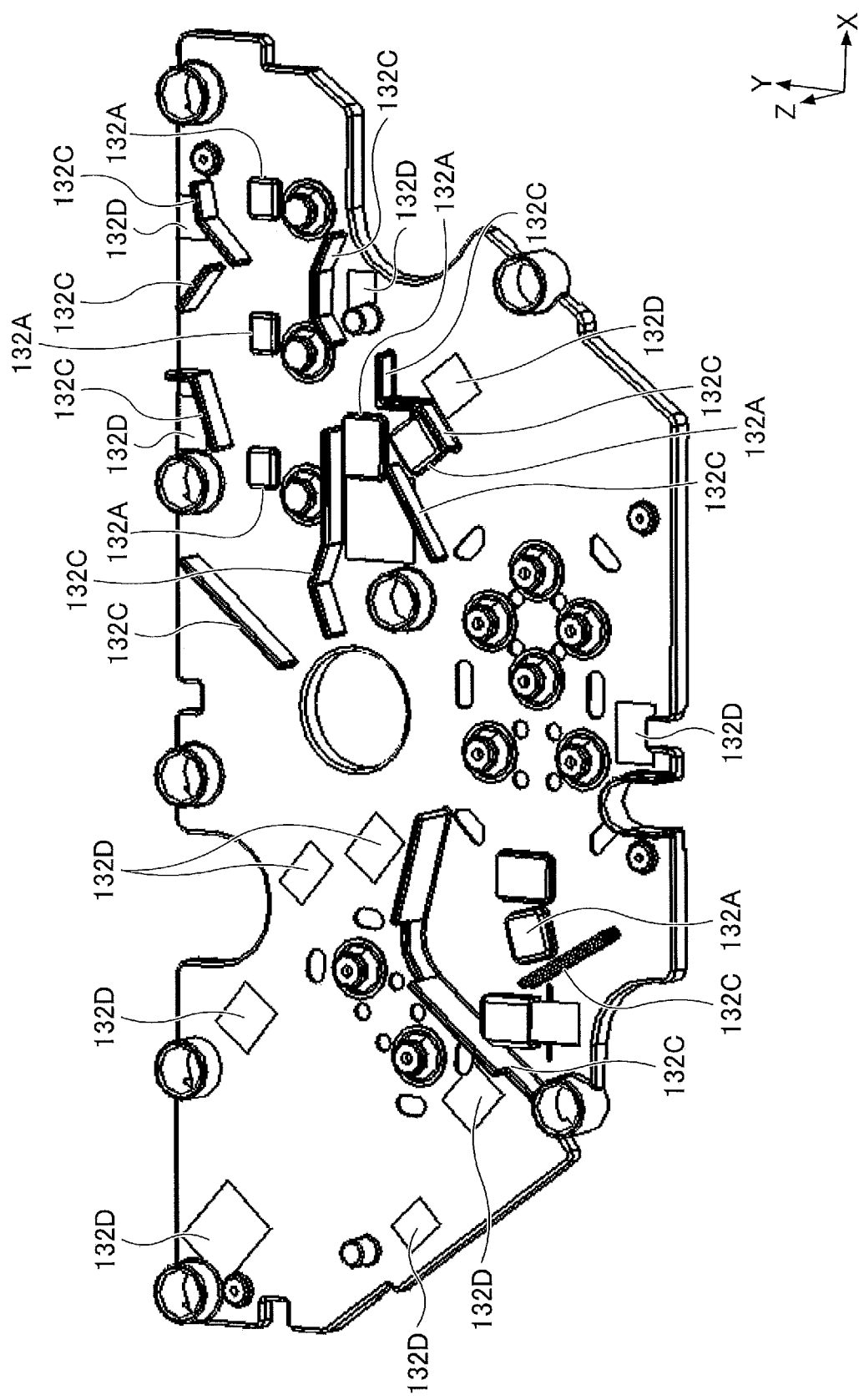
FIG. 7 is a diagram illustrating a surface configuration of a rubber sheet provided in a power seat switch according to an embodiment.

FIG. 7 is a diagram illustrating a surface configuration of a rubber sheet 132 provided in a power seat switch 100 according to an embodiment. In FIG. 7, a configuration of the top surface of the rubber sheet 132 is illustrated.

As illustrated in FIG. 7, on the top surface of the rubber sheet 132, the mirror parts 132D are provided at multiple portions each corresponding to each of the multiple through holes 110E formed in the housing 110; and thereby, the power seat switch 100 of the present embodiment can suppress light guided through the inside of the rubber sheet 132 from leaking out of the through holes 110E, for each of the multiple through holes 110E.

Also, in the rubber sheet 132, for each of the multiple portions corresponding to each of the multiple through holes 110E, the mirror part 132D is provided not only on the top surface (the surface of the through hole 110E side) but also on the bottom surface (the surface of the substrate 131 side); and thereby, the power seat switch 100 of the present embodiment can suppress light guided through the inside of the rubber sheet 132 from leaking out of the through holes 110E, that would be caused by scattering of the light on the bottom surface of the rubber sheet 132, and by part of the scattered light being emitted out of the top surface of the rubber sheet 132, for each of the multiple through holes 110E.

Also, on the top surface of the rubber sheet 132, the protruding parts 132A are provided at multiple portions covering the multiple LEDs 133 and 134. Mirroring is applied to the surface of each of the protruding parts 132A; and thereby, the power seat switch 100 of the present embodiment can suppress scattering of emitted light caused by the surface of the protruding part 132A, and suppress the amount of light directed to the through hole 110E from the protruding part 132A, for each of the multiple LEDs 133 and 134, and consequently, can suppress leak of light out of the through hole 110E.

Also, on the top surface of the rubber sheet 132, a wall part 132C that stands vertically is provided at each of multiple positions between the mirror part 132D and the protruding part 132A; and thereby, the power seat switch 100 of the present embodiment can shield light from the protruding part 132A to the vicinity of the through hole 110E by the wall part 132C, and consequently, can suppress leak of light out of the through hole 110E.

As described above, the power seat switch 100 according to an embodiment has the mirror parts 132D that totally reflect light guided through the inside of the rubber sheet 132 on the surface of the portions corresponding to the through holes 110E on the rubber sheet 132; and thereby, the power seat switch 100 according to an embodiment can suppress light guided through the inside of the rubber sheet 132 from being emitted out of the surface of the portions corresponding to the through holes 110E. Therefore, the power seat switch 100 according to an embodiment can suppress leak of light out of the through holes 110E.

In particular, the power seat switch 100 according to an embodiment has the mirror parts 132D on the top surface and on the bottom surface of the rubber sheet 132 at the portions corresponding to the through holes 110E; and thereby, the power seat switch 100 according to an embodiment can suppress light guided through the inside of the rubber sheet 132 from emitting directly out of the top surface at the portions corresponding to the through holes 110E, and can suppress the light from being scattered on the bottom surface at the portions corresponding to the through holes 110E to be emitted out of the top surface of the portions corresponding to the through holes 110E. Therefore, the power seat switch 100 according to an embodiment can suppress leak of light out of the through holes 110E.

Also, in the power seat switch 100 according to an embodiment, surface texturing is applied to portions on the surface of the rubber sheet 132 excluding the mirror parts 132D, to make the portions have a lower reflectivity than the mirror parts 132D; and thereby, the power seat switch 100 according to an embodiment can improve the release performance of the rubber sheet 132 from a mold without impairing the effect of suppressing leak of light obtained by the mirror parts 132D.

Also, in the power seat switch 100 according to an embodiment, mirroring (an example of a "light transmission part" described in the claims) is applied to the protruding parts 132A in the rubber sheet 132, to transmit light emitted from the LEDs 133 and 134 from the downside toward the upside with a low loss; and thereby, the power seat switch 100 of the present embodiment can cause light emitted from each of the LEDs 133 and 134 to be emitted upward from the protruding part 132A, and efficiently guide the light to the corresponding light emitting part 123 or 124A without scattering the light in the protruding part 132A. Therefore, the power seat switch 100 of the present embodiment can suppress the amount of light directed to the through holes 110E from the protruding parts 132A, and thereby, can suppress leak of light out of the through holes 110E.

Also, the power seat switch 100 according to an embodiment has the cylinder parts 110F inside the housing 110 each of which surrounds the corresponding through hole 110E and extending from the through hole 110E to the internal space 110C; and thereby, the power seat switch 100 of the present embodiment can shield light guided through the inside of the housing 110, so as to prevent the light from entering the through hole 110E by the cylinder part 110F. Therefore, the power seat switch 100 of the present embodiment can suppress leak of light out of the through holes 110E.

Also, the power seat switch 100 according to an embodiment has the wall parts 132C each of which stands between a position corresponding to the through hole 110E and a position corresponding to the LED 133 or 134 on the surface of the rubber sheet 132; and thereby, the power seat switch 100 of the present embodiment can shield light directed to the vicinity of the through holes 110E from the LEDs 133 and 134, by the wall part 132C. Therefore, the power seat switch 100 of the present embodiment can suppress leak of light out of the through holes 110E.

Also, in the power seat switch 100 according to an embodiment, surface texturing is applied between the mirror parts 132D and the protruding parts 132A covering the LEDs 133 and 134, on the rubber sheet 132; and thereby, the power seat switch 100 of the present embodiment can improve the release performance of a mold from the rubber sheet 132 without impairing the effect of suppressing leak of light.

As above, embodiments according to the present disclosure have been described; note that the present disclosure is not limited to these embodiments, and various changes and modifications can be made within the scope of the present disclosure as described in the claims.

For example, in the above embodiments, although examples have been described in which the present disclosure is applied to a power seat switch, the present disclosure is not limited as such, and can be applied to any devices and any switching devices, as long as at least adopting a configuration that causes a light emitting object to emit light inside a housing.

Also, for example, in the above embodiments, although the mirror parts are provided on both the top surface and the bottom surface at the portions corresponding to the through holes of the rubber sheet, the configuration is not limited as such, and the mirror parts may be provided only on the top surface at the portions corresponding to the through holes of the rubber sheet.

Also, for example, in the above embodiments, although the through holes as parts of the light leakage suppressing structure are provided as through holes for forming engagement claws of the snap-fit structure, the configuration is not limited as such, and the through holes as the parts of the light leakage suppressing structure may be any type of through holes formed in the housing.

What is claimed is:

1. A switch device comprising:
    a housing;
    a substrate provided inside the housing;
    a light emitting object mounted on one side of the substrate; and
    an, elastic sheet covering the one side of the substrate and the light emitting object, to guide light from the light emitting object,
    wherein a through hole is formed in the housing corresponding to the one side of the substrate,
    wherein the elastic sheet has a mirror part at a portion on a surface corresponding to the through hole, for totally reflecting light transmitting through an inside of the elastic sheet, and
    wherein the mirror part overlaps an entirety of the through hole in a plan view when viewed from a direction perpendicular to the substrate.

2. The switch device as claimed in claim 1 wherein the mirror part is provided on the surface on the one side of the elastic sheet, and another mirror part is provided on a surface on another side of the elastic sheet.

3. The switch device as claimed in claim 1, wherein the elastic sheet has a textured portion provided at a portion excluding the mirror part, and having a lower reflectivity than the mirror part.

4. The switch device as claimed in claim 1, wherein the elastic sheet has a light transmission part at a portion covering the light emitting object, for transmitting light from the light emitting object to one side from another side of the elastic sheet with a low loss.

5. The switch device as claimed in claim 1, wherein the housing has a cylinder part surrounding a vicinity of the through hole and extending toward the one side of the substrate.

6. The switch device as claimed in claim 1, wherein the elastic sheet has a wall part standing on one side between the mirror part and the portion covering the light emitting object.

7. The switch device as claimed in claim 1, further comprising:
    an attachment member attached to one side of the housing by being engaged with an engagement claw provided on the housing,
    wherein the engagement claw is provided on one side of the through hole corresponding to the through hole.

8. The switch device as claimed in claim 1, wherein the switch device further comprises an operation object provided on the housing so that the operation object does not overlap the through hole in the plan view.

9. The switch device as claimed in claim 3, wherein the elastic sheet is provided with the textured portion between the mirror part and a portion covering the light emitting object.

10. An operation device for operating a power seat of a vehicle, comprising:
    a housing;
    a substrate provided inside the housing;
    a light emitting object mounted on one side of the substrate; and
    an elastic sheet covering the one side of the substrate and the light emitting object, to guide light from the light emitting object,
    wherein a through hole is formed in the housing corresponding to the one side of the substrate,
    wherein the elastic sheet has a mirror part at a portion on the surface corresponding to the through hole, for totally reflecting light transmitting through an inside of the elastic sheet, and
    wherein the mirror part overlaps an entirety of the through hole in a plan view when viewed from a direction perpendicular to the substrate.

* * * * *